(12) United States Patent
Hoshi et al.

(10) Patent No.: US 9,960,235 B2
(45) Date of Patent: May 1, 2018

(54) SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Yuichi Harada, Matsumoto (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/279,840

(22) Filed: Sep. 29, 2016

(65) Prior Publication Data

US 2017/0018609 A1 Jan. 19, 2017

Related U.S. Application Data

(63) Continuation of application No. PCT/JP2015/072908, filed on Aug. 13, 2015.

(30) Foreign Application Priority Data

Sep. 11, 2014 (JP) ................................. 2014-185709

(51) Int. Cl.
*H01L 29/15* (2006.01)
*H01L 29/06* (2006.01)
(Continued)

(52) U.S. Cl.
CPC ...... *H01L 29/0696* (2013.01); *H01L 29/0646* (2013.01); *H01L 29/0865* (2013.01);
(Continued)

(58) Field of Classification Search
CPC ............ H01L 29/0646; H01L 29/0696; H01L 29/0865; H01L 29/1095; H01L 29/12; H01L 29/1608; H01L 29/78; H01L 29/15
(Continued)

(56) References Cited

U.S. PATENT DOCUMENTS 4,672,407 A 6/1987 Nakagawa et al.
2013/0234161 A1 9/2013 Shimizu et al.
(Continued)

FOREIGN PATENT DOCUMENTS

JP S60-254658 A 12/1985
JP S63-289871 A 11/1988
(Continued)

*Primary Examiner* — Marvin Payen
(74) *Attorney, Agent, or Firm* — Rabin & Berdo, P.C.

(57) ABSTRACT

A semiconductor device including a semiconductor substrate of a first conductivity type, a plurality of base regions of a second conductivity type formed on a first principal surface of the semiconductor substrate via a semiconductor layer of the first conductivity type, and a plurality of source regions of the first conductivity type formed in the base regions. Each base region, in a top-down view from an angle perpendicular to the first principle surface, is of a polygonal shape. Each adjacent two of the base regions in the top-down view have two sides, one from each of the two base regions, that face each other across a portion of the semiconductor layer, the source region being formed at only one of the two sides.

7 Claims, 6 Drawing Sheets

(51) Int. Cl.
    *H01L 29/78*     (2006.01)
    *H01L 29/12*     (2006.01)
    *H01L 29/08*     (2006.01)
    *H01L 29/10*     (2006.01)
    *H01L 29/16*     (2006.01)

(52) U.S. Cl.
    CPC .......... *H01L 29/1095* (2013.01); *H01L 29/12* (2013.01); *H01L 29/1608* (2013.01); *H01L 29/78* (2013.01); *H01L 29/7802* (2013.01)

(58) Field of Classification Search
    USPC .................................................... 257/72–79
    See application file for complete search history.

(56) References Cited

U.S. PATENT DOCUMENTS

2015/0053999 A1\*   2/2015   Kumagai ............ H01L 29/0615
                                                               257/77
2015/0102363 A1     4/2015   Tanaka et al.

FOREIGN PATENT DOCUMENTS

| JP | 2013-102106 A | 5/2013 |
| JP | 2013-187302 A | 9/2013 |
| JP | 2013-247252 A | 12/2013 |

\* cited by examiner

SEMICONDUCTOR DEVICE

CROSS REFERENCE TO RELATED APPLICATIONS

This is a continuation application of International Application PCT/JP2015/072908 filed on Aug. 13, 2015 which claims priority from a Japanese Patent Application No. 2014-185709 filed on Sep. 11, 2014, the contents of which are incorporated herein by reference.

BACKGROUND OF THE INVENTION

1. Field of the Invention

The embodiments discussed herein relate to a semiconductor device.

2. Description of the Related Art

FIG. 7 is a cross-sectional view of a first example of a conventional semiconductor device. As depicted in FIG. 7, the semiconductor device includes an n-type silicon carbide semiconductor layer 102 on a front surface of an $n^+$-type silicon carbide type semiconductor substrate 101. Plural p-type semiconductor regions 103 are disposed in a surface region of the n-type silicon carbide semiconductor layer 102. An $n^+$-type source region 104 and a $p^+$-type contact region 105 are disposed in a surface region of the p-type semiconductor region 103. A gate electrode 107 is disposed through a gate insulating film 106 on the p-type semiconductor region 103 between the $n^+$-type source region 104 and the n-type silicon carbide semiconductor layer 102. A source electrode 108 contacts the $n^+$-type source region 104 and the $p^+$-type contact region 105. A drain electrode 109 is disposed on a back surface of the $n^+$-type silicon carbide type semiconductor substrate 101 (see, for example, Japanese Laid-Open Patent Publication No. 2013-187302).

FIG. 8 is a cross-sectional view of a second example of the conventional semiconductor device. As depicted in FIG. 8, the semiconductor device includes an n-type silicon carbide semiconductor layer 202 on a front surface of an $n^+$-type silicon carbide semiconductor substrate 201. Plural $p^+$-type semiconductor regions 210 are disposed in a surface region of the n-type silicon carbide semiconductor layer 202. A $p^+$-type silicon carbide semiconductor layer 211 is disposed on the $p^+$-type semiconductor region 210 and the n-type silicon carbide semiconductor layer 202. In the $p^+$-type silicon carbide semiconductor layer 211, an n-type semiconductor region 212 is disposed on the n-type silicon carbide semiconductor layer 202 between the $p^+$-type semiconductor region 210 and the $p^+$-type semiconductor region 210 that are adjacent to each other. In the $p^+$-type silicon carbide semiconductor layer 211, a p-type semiconductor region 203, an $n^+$-type source region 204, and a $p^+$-type contact region 205 are disposed on the $p^+$-type semiconductor regions 210. A gate electrode 207 is disposed through a gate insulating film 206 on the p-type semiconductor region 203 between the $n^+$-type source region 204 and the n-type semiconductor region 212. A source electrode 208 contacts the $n^+$-type source region 204 and the $p^+$-type contact region 205. A drain electrode 209 is disposed on a back surface of the $n^+$-type silicon carbide semiconductor substrate 201 (see, for example, Japanese Laid-Open Patent Publication No. 2013-102106).

FIG. 9 is a plan diagram of a layout of the conventional semiconductor device. As depicted in FIG. 9, for example, in a semiconductor device similar to the first example, the p-type semiconductor regions 103 each having, for example, a hexagonal planar shape are disposed and the $n^+$-type source region 104 is disposed in an annular shape continuously along the six sides of the hexagonal shape of each of the p-type semiconductor regions 103. The gate electrode 107 is disposed to be continuous between adjacent p-type semiconductor regions 103, at facing sides of adjacent p-type semiconductor regions 103. The same is true for a semiconductor device similar to the second example.

SUMMARY OF THE INVENTION

According to one aspect of the present invention, a semiconductor device includes a semiconductor substrate of a first conductivity type and comprising silicon carbide; a semiconductor layer of the first conductivity type, disposed on a first principal surface of the semiconductor substrate and having an impurity concentration lower than that of the semiconductor substrate; a base region of a second conductivity type, disposed in a surface region of the semiconductor layer; a source region of the first conductivity type, disposed in a surface region of the base region; a contact region of the second conductivity type, disposed in the surface region of the base region and having an impurity concentration higher than that of the base region; a source electrode disposed so as to contact the source region and the contact region; a gate insulating film disposed on a surface of a region of the base region, between the semiconductor layer and the source region; a gate electrode disposed on a surface of the gate insulating film; and a drain electrode that is disposed on a second principal surface of the semiconductor substrate. A planar shape of the base region is a polygonal shape. The source region is disposed to form an island that extends along the gate electrode. One or more of the source regions are disposed only on one of two sides facing each other of the polygonal shape, in the base region.

According to another aspect of the present invention, a semiconductor device includes a semiconductor substrate of a first conductivity type and comprising silicon carbide; a semiconductor layer of the first conductivity type, disposed on a first principal surface of the semiconductor substrate and having an impurity concentration lower than that of the semiconductor substrate; a semiconductor region of a second conductivity type, disposed in a portion of a surface region of the semiconductor layer; a base region of the second conductivity type, disposed on a surface of the semiconductor region and having an impurity concentration lower than that of the semiconductor region; a well region of the first conductivity type and comprising silicon carbide, the well region being disposed on a surface of the semiconductor layer so as to contact the base region and have an impurity concentration lower than that of the semiconductor substrate; a source region of the first conductivity type, disposed in a surface region of the base region so as to be away from the well region, the source region having an impurity concentration higher than that of the well region; a contact region of the second conductivity type, disposed on the surface of the semiconductor region so as to contact the source region and the base region, the contact region having an impurity concentration higher than that of the base region; a source electrode disposed so as to contact the source region and the contact region; a gate insulating film disposed on a surface of a region of the base region, between the well region and the source region; a gate electrode disposed on a surface of the gate insulating film; and a drain electrode disposed on a second principal surface of the semiconductor substrate. A planar shape of the base region is a polygonal shape. The source region is disposed to form an island along the gate electrode. One or more of the source regions are disposed only on one of two sides facing each other of the polygonal shape, in the base region.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
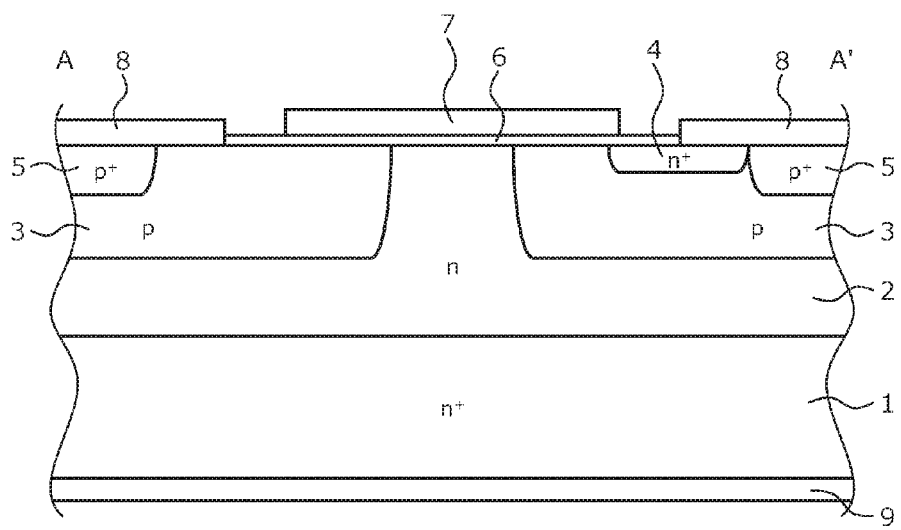
FIG. 1 is a cross-sectional view of a first example of a semiconductor device according to a first embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

FIG. 1 is a cross-sectional view of a first example of the semiconductor device according to a first embodiment of the present invention. FIG. 1 depicts an active region of the semiconductor device. In the active region, a metal oxide semiconductor (MOS) structure, that is, an element structure of the semiconductor device is disposed. The active region may be surrounded by an edge termination structure region not depicted.

As depicted in FIG. 1, the semiconductor device includes an $n^+$-type semiconductor substrate 1 and an n-type semiconductor layer 2 that each includes silicon carbide. The $n^+$-type semiconductor substrate 1 may be, for example, a silicon carbide single crystal substrate having an N-type impurity doped in silicon carbide. The $n^+$-type semiconductor substrate 1 forms, for example, a drain region. In the description of this embodiment, the front surface of the $n^+$-type semiconductor substrate 1 is assumed to be a first principal surface and a back surface thereof is assumed to be a second principal surface.

The n-type semiconductor layer 2 is disposed on the first principal surface of the $n^+$-type semiconductor substrate 1. The impurity concentration of the n-type semiconductor layer 2 is lower than that of the $n^+$-type semiconductor substrate 1. The n-type semiconductor layer 2 may be, for example, a semiconductor layer having an N-type impurity doped in silicon carbide. The n-type semiconductor layer 2 forms, for example, an N-type drift layer.

The semiconductor device includes, for example, a p-type base region 3, an $n^+$-type source region 4, a $p^+$-type contact region 5, a gate insulating film 6, a gate electrode 7, and a source electrode 8 as a MOS structure on the first principal surface side of the $n^+$-type semiconductor substrate 1. The semiconductor device includes, for example, a back surface electrode to be a drain electrode 9 on the second principal surface side of the $n^+$-type semiconductor substrate 1.

The p-type base region 3 is disposed in a portion of the surface region of the n-type semiconductor layer 2. The p-type base region 3, for example, may be disposed to sandwich another portion of the surface region of the n-type semiconductor layer 2. A region of the n-type semiconductor layer 2 may be between adjacent p-type first semiconductor regions 3. The p-type base region 3 may be, for example, a semiconductor region having a P-type impurity doped in silicon carbide.

The $n^+$-type source region 4 is disposed in a surface region of the p-type base region 3. The $n^+$-type source region 4 is disposed away from the region of the n-type semiconductor layer 2 between adjacent p-type base regions 3. The impurity concentration of the $n^+$-type source region 4 is higher than that of the n-type semiconductor layer 2. Although not particularly limited hereto, in the example depicted in FIG. 1, for example, the $n^+$-type source region 4 is disposed in the p-type base region 3 on the side of A' while the $n^+$-type source region 4 is not disposed in the p-type base region 3 on the side of A. "A" and "A'" in the above refer to A and A' of cutting line A-A' depicted in FIG. 3.

In the surface region of the p-type base region 3, the $p^+$-type contact region 5 is disposed away from the region of the n-type semiconductor layer 2 between the adjacent p-type base regions 3. The $p^+$-type contact region 5 contacts the p-type base region 3 and the $n^+$-type source region 4. The impurity concentration of the $p^+$-type contact region 5 is higher than that of the p-type base region 3.

The gate insulating film 6 is disposed on the surface of the p-type base region 3, at a region between the region of the n-type semiconductor layer 2 between the adjacent p-type base regions 3 and the $n^+$-type source region 4. The gate insulating film 6 may extend, for example, from a position on the surface of the p-type base region 3 on the side of A of the adjacent p-type base regions 3 sandwiching the region of the n-type semiconductor layer 2 therebetween to a position on the surface of the $n^+$-type source region 4 on the side of A', through a position on the surface of the region of the n-type semiconductor layer 2.

The gate electrode 7 is disposed on the surface of the gate insulating film 6. The gate electrode 7 may extend, for example, from a position on the p-type base region 3 on the side of A of the adjacent p-type base regions 3 sandwiching the region of the n-type semiconductor layer 2 therebetween to a position on the $n^+$-type source region 4 on the side of A', through a position on the surface of the region of the n-type semiconductor layer 2.

The source electrode 8 is disposed on the surfaces of the n$^+$-type source region 4 and the p$^+$-type contact region 5 so as to contact the n$^+$-type source region 4 and the p$^+$-type contact region 5. The source electrode 8 is electrically connected to the n$^+$-type source region 4 and the p$^+$-type contact region 5. The source electrode 8 is insulated from the gate electrode 7 by an interlayer insulating film not depicted.

The drain electrode 9 is disposed on the second principal surface of the n$^+$-type semiconductor substrate 1. The drain electrode 9 forms an ohmic contact with the n$^+$-type semiconductor substrate 1.

A first example of a method of manufacturing a semiconductor device will be described. The n$^+$-type semiconductor substrate 1 including N-type silicon carbide is prepared. The n-type semiconductor layer 2 including silicon carbide is epitaxial-grown on the first principal surface of the n$^+$-type semiconductor substrate 1 while being concurrently doped with an N-type impurity.

A P-type impurity is ion-implanted into the surface region of the n-type semiconductor layer 2, at a region to be the p-type base region 3, by a photolithography technique and an ion implantation method. An N-type impurity is ion-implanted into a region to be the n$^+$-type source region 4 of the ion-implanted region to be the p-type base region 3 by a photolithography technique and an ion implantation method.

A P-type impurity is ion-implanted into a region to be the p$^+$-type contact region 5 of the ion-implanted region to be the p-type base region 3 by a photolithography technique and an ion implantation method. The order of the ion implantation to dispose the p-type base region 3, the ion implantation to dispose the n$^+$-type source region 4, and the ion implantation to dispose the p$^+$-type contact region 5 is not limited to the above order and may be changed variously.

The ion-implanted regions to be, for example, the p-type base region 3, the n$^+$-type source region 4, and the p$^+$-type contact region 5 are activated by heat treatment (annealing). The p-type base region 3, the n$^+$-type source region 4, and the p$^+$-type contact region 5 are thereby formed. The ion-implanted regions may be activated collectively by a single heat treatment session as above, or each of the ion-implanted regions may be activated by executing the heat treatment each time the ion implantation is executed for a region.

A face on the side on which the p-type base region 3, the n$^+$-type source region 4, and the p$^+$-type contact region 5 are disposed is thermally oxidized to dispose the gate insulating film 6 on the entire face. The gate electrode 7 is disposed on the gate insulating film 6.

A metal film to become the source electrode 8 is disposed so as to contact the n$^+$-type source region 4 and the p$^+$-type contact region 5. A metal film to become the drain electrode 9 is disposed on the second principal surface of the n$^+$-type semiconductor substrate 1. Heat treatment is executed to dispose the source electrode 8 and the drain electrode 9. The n$^+$-type semiconductor substrate 1 and the drain electrode 9 form an ohmic contact with each other. In this manner, the semiconductor device depicted in FIG. 1 is completed.

Figure 2:
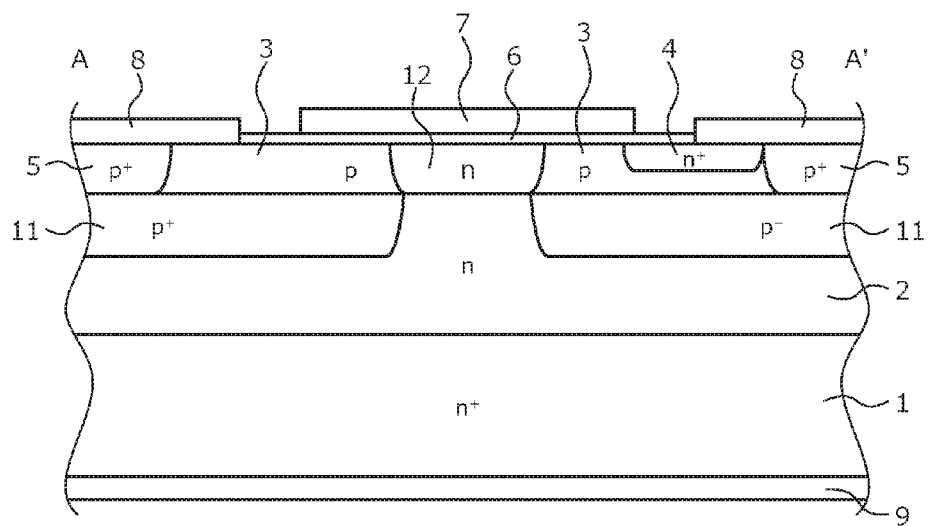
FIG. 2 is a cross-sectional view of a second example of the semiconductor device according to the first embodiment of the present invention.

FIG. 2 is a cross-sectional view of a second example of the semiconductor device according to the first embodiment of the present invention. FIG. 2 depicts the active region of the semiconductor device. The second example is similar to the first example of the semiconductor device depicted in FIG. 1 in that the MOS structure of the semiconductor device is disposed in the active region and that the active region may be surrounded by the edge termination structure region.

As depicted in FIG. 2, the semiconductor device includes the n$^+$-type semiconductor substrate 1 and the n-type semiconductor layer 2. The n$^+$-type semiconductor substrate 1 and the n-type semiconductor layer 2 are same as those of the first example of the semiconductor device and will not again be described.

The semiconductor device includes, for example, the p-type base region 3, the n$^+$-type source region 4, the p$^+$-type contact region 5, the gate insulating film 6, the gate electrode 7, the source electrode 8, a p$^+$-type semiconductor region 11, and an n-type well region 12 as a MOS structure on the first principal surface side of the n$^+$-type semiconductor substrate 1. The semiconductor device includes, for example, a back surface electrode to be the drain electrode 9 on the second principal surface side of the n$^+$-type semiconductor substrate 1.

The p$^+$-type semiconductor region 11 is disposed in a portion of the surface region of the n-type semiconductor layer 2. The p$^+$-type semiconductor region 11 may be disposed, for example, to sandwich another portion of the surface region of the n-type semiconductor layer 2. A region of the n-type semiconductor layer 2 may be present between adjacent p$^+$-type semiconductor regions 11. The p$^+$-type semiconductor region 11 may be a semiconductor region having, for example, a P-type impurity doped in silicon carbide.

The p-type base region 3 is disposed on the surface of the p$^+$-type semiconductor region 11. The impurity concentration of the p-type base region 3 is lower than that of the p$^+$-type semiconductor region 11. The p-type base region 3 may be, for example, a semiconductor region having a P-type impurity doped in silicon carbide. The p-type base region 3 may be, for example, a portion of a p-type semiconductor layer stacked on the n-type semiconductor layer 2 using an epitaxial growth method.

The n-type well region 12 is disposed on the surface of the n-type semiconductor layer 2, at the region between the adjacent p$^+$-type semiconductor regions 11. The n-type well region 12 is disposed to be in contact with the p-type base region 3. The impurity concentration of the n-type well region 12 is lower than that of the n$^+$-type semiconductor substrate 1. The n-type well region 12 may be, for example, a region formed by inverting the conductivity type of a portion of the p-type semiconductor layer stacked on the n-type semiconductor layer 2 using the epitaxial growth method as above, using ion implantation of an N-type impurity and heat treatment. The n-type well region 12 and, for example, the n-type semiconductor layer 2 form an N-type drift region.

The n$^+$-type source region 4 is disposed in the surface region of the p-type base region 3 on the p$^+$-type semiconductor region 11. The n$^+$-type source region 4 is disposed away from the n-type well region 12. The impurity concentration of the n$^+$-type source region 4 is higher than that of the n-type well region 12. Although not particularly limited hereto, in the example depicted in FIG. 2, for example, the n$^+$-type source region 4 is disposed in the p-type base region 3 on the side of A' while the n$^+$-type source region 4 is not disposed in the p-type base region 3 on the side of A. "A" and "A'" are as described in the first example.

The p$^+$-type contact region 5 is disposed on the side opposite to that of the n-well region sandwiching the p-type base region 3 therebetween, that is, away from the n-type well region 12. The p$^+$-type contact region 5 contacts the p-type base region 3 and the n$^+$-type source region 4. For example, as described above, the p$^+$-type contact region 5 penetrates the p-type semiconductor layer to be the p-type base region 3 on the n-type semiconductor layer 2 to contact the p$^+$-type semiconductor region 11. The impurity concentration of the p$^+$-type contact region 5 is higher than that of the p-type base region 3.

The gate insulating film 6 is disposed on the surface of the region sandwiched by the n-type well region 12 and the n$^+$-type source region 4, of the p-type base region 3. The gate insulating film 6 may extend, for example, from a position on the surface of the p-type base region 3 on the side of A of the p-type base regions 3 adjacent to each other sandwiching the n-type well region 12 therebetween to a position on the surface of the n$^+$-type source region 4 on the side of A', through a position on the surface of the n-type well region 12.

The gate electrode 7 is disposed on the surface of the gate insulating film 6. The gate electrode 7 may extend, for example, from a position on the p-type base region 3 on the side of A of the p-type base regions 3 adjacent to each other sandwiching the n-type well region 12 therebetween to a position on the n$^+$-type source region 4 on the side of A', through a position on the n-type well region 12.

The source electrode 8 and the drain electrode 9 are same as those of the first example of the semiconductor device and will not again be described.

A second example of the method of manufacturing a semiconductor device will be described. The n$^+$-type semiconductor substrate 1 including N-type silicon carbide is first prepared. The n-type semiconductor layer 2 including silicon carbide is epitaxial-grown being concurrently doped with an N-type impurity, on the first principal surface of the n$^+$-type semiconductor substrate 1.

A P-type impurity is ion-implanted into the region to be the p$^+$-type semiconductor region 11 of the surface region of the n-type semiconductor layer 2 by a photolithography technique and an ion implantation method. A p-type semiconductor layer including silicon carbide is epitaxial-grown being concurrently doped with a P-type impurity, on the surface of the n-type semiconductor layer 2. This p-type semiconductor layer forms the p-type base region 3.

An N-type impurity is ion-implanted into the region to be the n-type well region 12 of the p-type semiconductor layer to be the p-type base region 3 by a photolithography technique and an ion implantation method. An N-type impurity is ion-implanted into the region to be the n$^+$-type source region 4 of the p-type semiconductor layer to be the p-type base region 3 by a photolithography technique and an ion implantation method.

A P-type impurity is ion-implanted into the region to be the p$^+$-type contact region 5 of the p-type semiconductor layer to be the p-type base region 3 by a photolithography technique and an ion implantation method. The order of the ion implantation to dispose the p$^+$-type semiconductor region 11, the ion implantation to dispose the n-type well region 12, the ion implantation to dispose the n$^+$-type source region 4, and the ion implantation to dispose the p$^+$-type contact region 5 is not limited to the above order and may be changed variously.

The ion-implanted regions to be, for example, the p$^+$-type semiconductor region 11, the n-type well region 12, the n$^+$-type source region 4, and the p$^+$-type contact region 5 are activated by executing heat treatment (annealing). The p$^+$-type semiconductor region 11, the n-type well region 12, the n$^+$-type source region 4, and the p$^+$-type contact region 5 are thereby formed. The ion-implanted regions may be activated collectively by a single heat treatment session as above, or each of the ion-implanted regions may be activated by executing the heat treatment each time the ion implantation is executed for a region.

A face on the side on which the p-type base region 3, the n$^+$-type source region 4, the p$^+$-type contact region 5, and the n-type well region 12 are disposed is thermally oxidized to dispose the gate insulating film 6 on the entire face. The gate electrode 7 is disposed on the gate insulating film 6.

A metal film to become the source electrode 8 is disposed to contact the n$^+$-type source region 4 and the p$^+$-type contact region 5. A metal film to become the drain electrode 9 is disposed on the second principal surface of the n$^+$-type semiconductor substrate 1. Heat treatment is executed to dispose the source electrode 8 and the drain electrode 9. The n$^+$-type semiconductor substrate 1 and the drain electrode 9 form an ohmic contact with each other. In this manner, the semiconductor device depicted in FIG. 2 is completed.

It is assumed in the first and the second example that a voltage lower than a threshold voltage Vth is applied to the gate electrode 7 when a positive voltage relative to that of the source electrode 8 is applied to the drain electrode 9. In this case, the PN-junction between the p-type base region 3 and the n-type semiconductor layer 2 in the first example and the PN-junction between the p-type base region 3 and the n-type well region 12 in the second example are each reversely biased and no current flows through the semiconductor device.

On the other hand, it is assumed in the first and the second example that a voltage equal to or higher than the threshold voltage Vth is applied to the gate electrode 7 when a positive voltage relative to that of the source electrode 8 is applied to the drain electrode 9. In this case, current flows through the semiconductor device because an inversion layer is formed in the p-type base region 3 beneath the gate electrode 7. As described above, the switching operation of the semiconductor device may be executed according to the voltage applied to the gate electrode 7.

Figure 3:
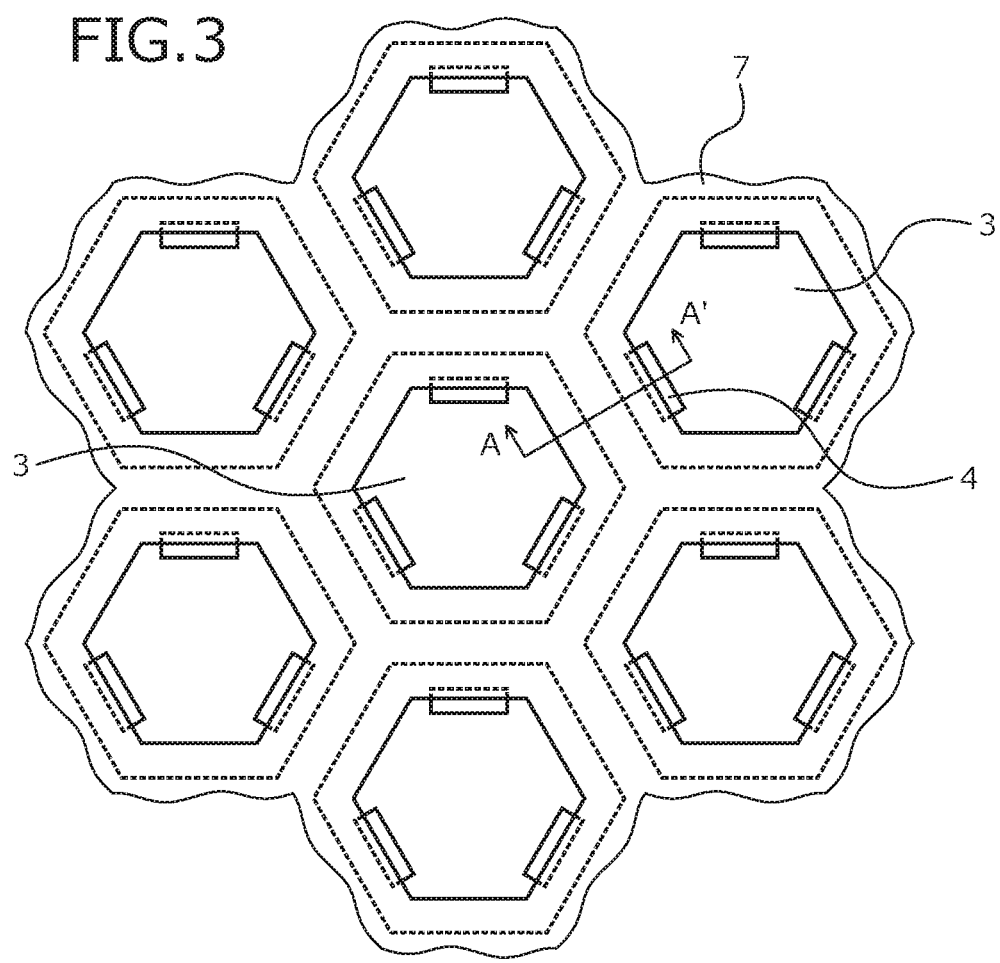
FIG. 3 is a plan diagram of an example of a layout of the semiconductor device according to the first embodiment of the present invention.

FIG. 3 is a plan diagram of an example of a layout of the semiconductor device according to the first embodiment of the present invention. In the first or the second example of the semiconductor device, the p-type base region 3 is disposed to form an island having a polygonal shape as a planar shape. Although not particularly limited hereto, for example, as in the example depicted in FIG. 3, the p-type base region 3 may have, for example, a hexagonal shape. The p-type base region 3 may have a square shape, may have an octagonal shape, or may have a polygonal shape having an even number of corners such as 10 or more.

The gate electrode 7 is disposed to be continuous between adjacent p-type base regions 3, at facing sides of adjacent p-type base regions 3.

The n$^+$-type source region 4 is disposed to form an island that extends along the gate electrode 7. Each of the p-type base regions 3 has the one or more island(s) of the n$^+$-source region(s) 4 disposed therein. Configuration may be such that the island of the n$^+$-type source region 4 is disposed only on one of the two sides facing each other of the polygonal shape of the p-type base region 3. Although not particularly limited hereto, for example, as in the example depicted in FIG. 3, the island of the n$^+$-type source region 4 may be disposed on every other side of the island of the p-type base regions 3, having a hexagonal shape. In the p-type base regions 3, the n$^+$-type source region 4 is not disposed on the side adjacent to the side at which the n$^+$-type source region 4 is disposed. The n$^+$-type source region 4 is not disposed on the side of a p-type base region 3, facing the side of an adjacent p-type base region 3, where the n$^+$-type source region 4 is disposed.

According to the first embodiment, in the surface region of the p-type base region 3, the region between islands of the n$^+$-source regions 4 or the region on the outer side of both ends of the island of the n$^+$-type source region 4 such as, for example, a side where the n$^+$-type source region 4 is not disposed does not act as the n$^+$-type source region 4 but acts as the p-type base region 3. In the region not to be the n$^+$-type source region 4 but to be the p-type base region 3, the thickness of the p-type base region 3 is increased by the thickness of the n$^+$-type source region 4 compared to that of the region having the n$^+$-type source region 4 disposed therein. The resistance of the p-type base region 3 is thereby reduced compared to that of the conventional configuration having the source region continuously disposed without any discontinuity along the gate electrode when the semiconductor device executes the switching operation to be turned off due to application of a high voltage to the drain electrode 9. Increase of the potential of the p-type base region 3 is therefore suppressed. Operation of the parasitic NPN-transistor is therefore suppressed and a large current can be caused to flow through the semiconductor device when the semiconductor device is turned off. The resistance to breakdown of the semiconductor device can therefore be improved.

In a second embodiment, a first example of the semiconductor device and the method of manufacturing the first example, and a second example of the semiconductor device and the method of manufacturing the second example are same as those of the first embodiment and will therefore not again be described. See FIG. 1 or 2 for the cross-sectional structure of the first example or the second example.

Figure 4:
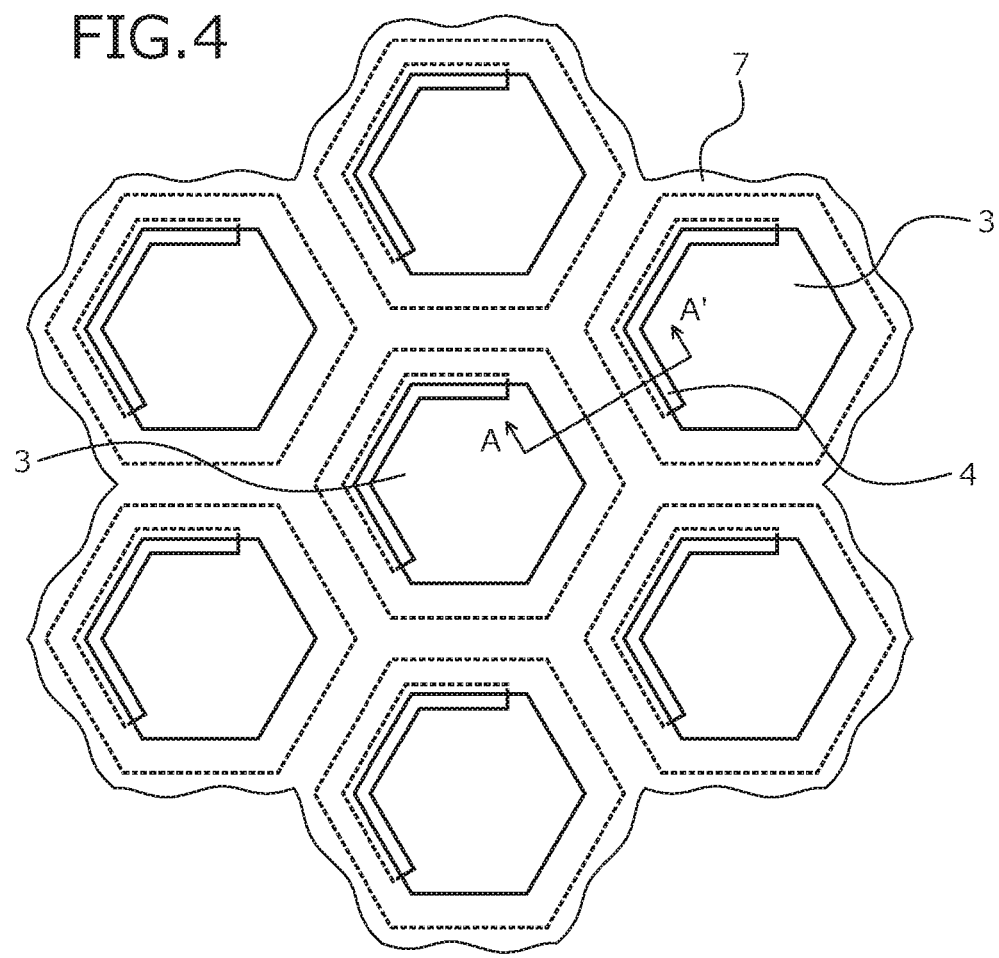
FIG. 4 is a plan diagram of an example of a layout of the semiconductor device according to a second embodiment of the present invention.

FIG. 4 is a plan diagram of an example of a layout of the semiconductor device according to the second embodiment of the present invention. As depicted in FIG. 4, in the first or the second example of the semiconductor device depicted in FIG. 1 or 2, the p-type base region 3 is disposed to form an island having a polygonal shape as a planar shape. Although not particularly limited hereto, for example, as in the example depicted in FIG. 3, the p-type base region 3 and the gate electrode 7 are same as those of the first embodiment and will not again be described.

The n$^+$-type source region 4 is disposed to form an island that extends along the gate electrode 7. Each of the p-type base regions 3 has the one or more island(s) of the n$^+$-source region(s) 4 disposed therein. Configuration may be such that the island of the n$^+$-type source region 4 is disposed only on one of the two sides facing each other of the polygonal shape of the p-type base region 3. Although not particularly limited hereto, for example, as in the example depicted in FIG. 4, the island of the n$^+$-type source region 4 may be continuously disposed parallel to each of three continuous sides in the island of each of the p-type base regions 3, having a hexagonal shape. In each of the p-type base regions 3, the n$^+$-type source region 4 is not disposed on the three sides that face the three continuous sides where the n$^+$-type source region 4 is disposed. The n$^+$-type source region 4 is not disposed on the side of a p-type base region 3, facing the side of an adjacent p-type base region 3, where the n$^+$-type source region 4 is disposed.

According to the second embodiment, in the surface region of the p-type base region 3, the side where the n$^+$-type source region 4 is not disposed does not act as the n$^+$-type source region 4 but acts as the p-type base region 3. In the region acting not as the n$^+$-type source region 4 but as the p-type base region 3, the thickness of the p-type base region 3 is increased by the thickness of the n$^+$-type source region 4 compared to that of the region where the n$^+$-type source region 4 is disposed. The resistance of the p-type base region 3 is thereby reduced compared to that of the conventional configuration having the source region continuously disposed therein without any discontinuity along the gate electrode when the semiconductor device executes the switching operation to be turned off due to application of a high voltage to the drain electrode 9. The resistance of the p-type base region 3 for the overall hexagonal cell is reduced by reducing the resistance of, for example, the p-type base region 3 in a half of the hexagonal cell. When the resistance of the p-type base region is reduced, increase of the potential of the p-type base region 3 is suppressed. Operation of the parasitic NPN-transistor is therefore suppressed and, when the semiconductor device is turned off, a large current can be caused to flow through the semiconductor device. The resistance to breakdown of the semiconductor device can be improved.

In a third embodiment, a first example of the semiconductor device and the method of manufacturing the first example, and a second example of the semiconductor device and the method of manufacturing the second example are same as those of the first embodiment and will therefore not again be described. See FIG. 1 or 2 for the cross-sectional structure of the first example or the second example. In FIGS. 1 and 2, the n$^+$-type source region 4 is disposed also in the p-type base region 3 on the side of A similarly to the p-type base region 3 on the side of A'.

Figure 5:
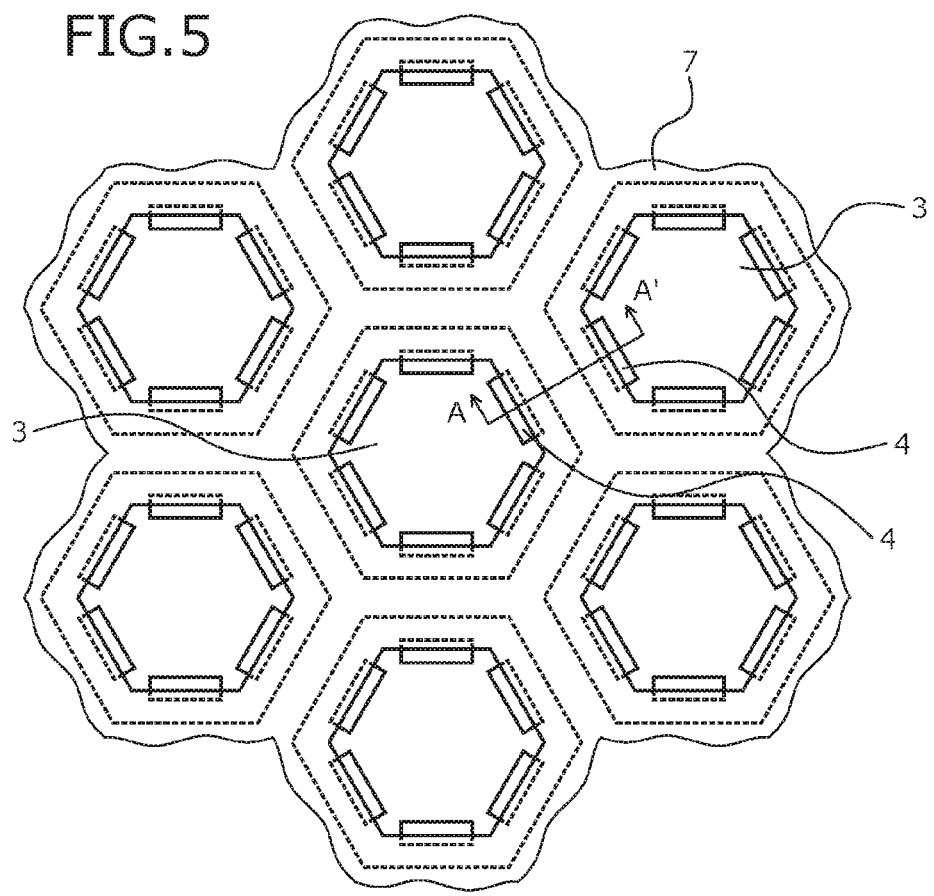
FIG. 5 is a plan diagram of an example of a layout of the semiconductor device according to a third embodiment of the present invention.

FIG. 5 is a plan diagram of an example of a layout of the semiconductor device according to the third embodiment of the present invention. As depicted in FIG. 5, in the first or the second example of the semiconductor device depicted in FIG. 1 or 2, the p-type base region 3 is disposed to form an island having a polygonal shape as a planar shape. Although not particularly limited hereto, for example, as in the example depicted in FIG. 3, the p-type base region 3 and the gate electrode 7 are same as those of the first embodiment and will not again be described. The p-type base region 3 may further have a triangular shape, have a pentagonal shape, have a heptagonal shape, or have a nonagonal shape.

The n$^+$-type source region 4 is disposed to form an island that extends along the gate electrode 7. The island of the n$^+$-type source region 4 is disposed to form the island for each side and along each of the two or more sides in each of the p-type base regions 3. Although not particularly limited hereto, the island of the n$^+$-type source region 4 may be disposed parallel to each of the sides in the island of each of the p-type base regions 3, having the hexagonal shape. The islands of the n$^+$-source regions 4 each disposed parallel to each of the sides of the hexagonal shape is however not continuous to any island of the n$^+$-type source region 4 disposed parallel to an adjacent side. The n$^+$-type source region 4 is not disposed in a vicinity of a corner of the hexagonal cell.

According to the third embodiment, in the surface region of the p-type base region 3, the vicinity of the corner does not act as the type source region 4 but acts as the p-type base region 3. In the vicinity of the corner of the p-type base region 3, the thickness of the p-type base region 3 is increased by the thickness of the type source region 4 compared to that of the region having the type source region 4 disposed therein. The resistance of the p-type base region 3 in the vicinity of the corner is thereby reduced compared to that of the conventional configuration having the source region disposed also in the vicinity of the corner on which the current tends to concentrate when the semiconductor device executes the switching operation to be turned off due to application of a high voltage to the drain electrode 9.

Increase of the potential of the p-type base region 3 is therefore suppressed. Operation of the parasitic NPN-transistor is therefore suppressed and a large current can be caused to flow through the semiconductor device when the semiconductor device is turned off. The resistance to breakdown of the semiconductor device may therefore be improved.

In a fourth embodiment, a first example of the semiconductor device and the method of manufacturing the first example, and a second example of the semiconductor device and the method of manufacturing the second example are same as those of the first embodiment and will therefore not again be described. See FIG. 1 or 2 for the cross-sectional structure of the first example or the second example. In FIGS. 1 and 2, the n$^+$-type source region 4 is disposed also in the p-type base region 3 on the side of A similarly to the p-type base region 3 on the side of A'.

Figure 6:
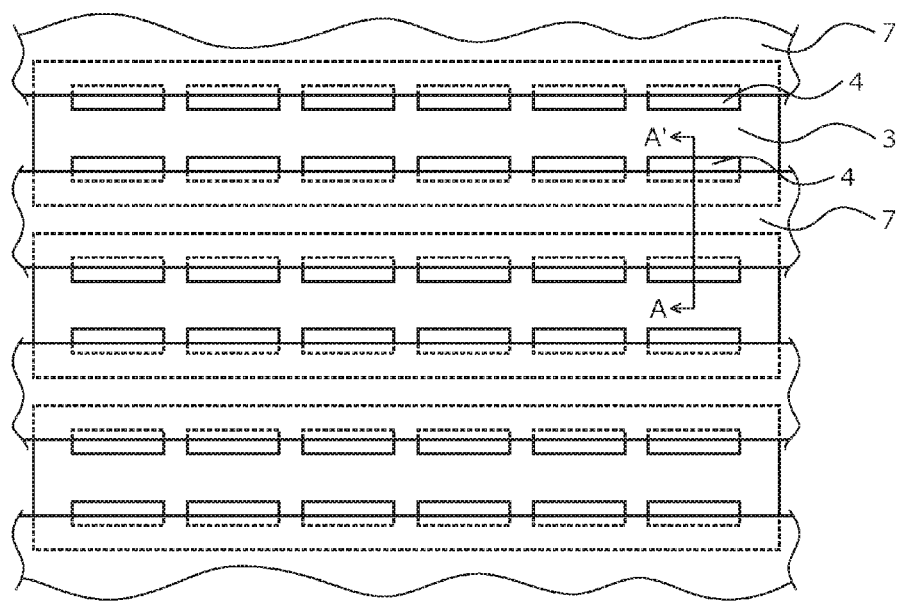
FIG. 6 is a plan diagram of an example of a layout of the semiconductor device according to a fourth embodiment of the present invention.

FIG. 6 is a plan diagram of an example of a layout of the semiconductor device according to the fourth embodiment of the present invention. As depicted in FIG. 6, in the first or the second example of the semiconductor device depicted in FIG. 1 or 2, the planar shape of the p-type base regions 3 is a striped-like shape. The gate electrode 7 is also disposed extending between a side in the longitudinal direction of each of the p-type base regions 3 and a side in the longitudinal direction of the adjacent p-type base region 3, facing the side of the p-type base region 3.

In each of the p-type base regions 3, the n$^+$-source regions 4 are disposed each to form an island extending along the longitudinal direction of the gate electrode 7.

According to the fourth embodiment, because the region in which the type source region 4 is not disposed acts as the p-type base region 3 in the surface region of the p-type base region 3, in the region between the islands of the n$^+$-source regions 4, the thickness of the p-type base region 3 is increased by the thickness of the type source region 4 compared to that of the region where the type source region 4 is disposed. The resistance of the p-type base region 3 is thereby reduced at constant intervals when the semiconductor device executes the switching operation to be turned off due to application of a high voltage to the drain electrode 9. Increase of the potential of the p-type base region 3 is therefore suppressed compared to that of the conventional configuration having the source region continuing without any discontinuity along the gate electrode. Operation of the parasitic NPN-transistor is suppressed and a large current can be caused to flow through the semiconductor device when the semiconductor device is turned off. The resistance to breakdown of the semiconductor device may therefore be improved.

Figure 7:
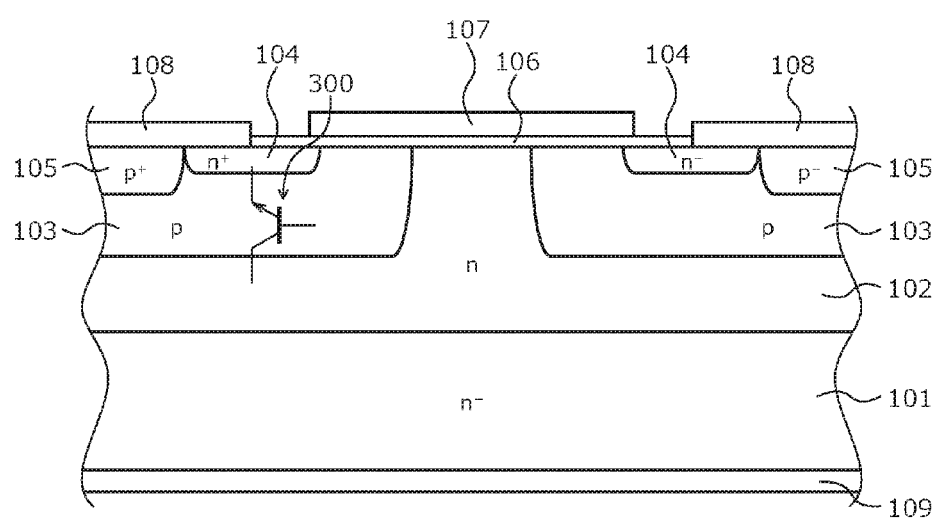
FIG. 7 is a cross-sectional view of a first example of a conventional semiconductor device.
Figure 8:
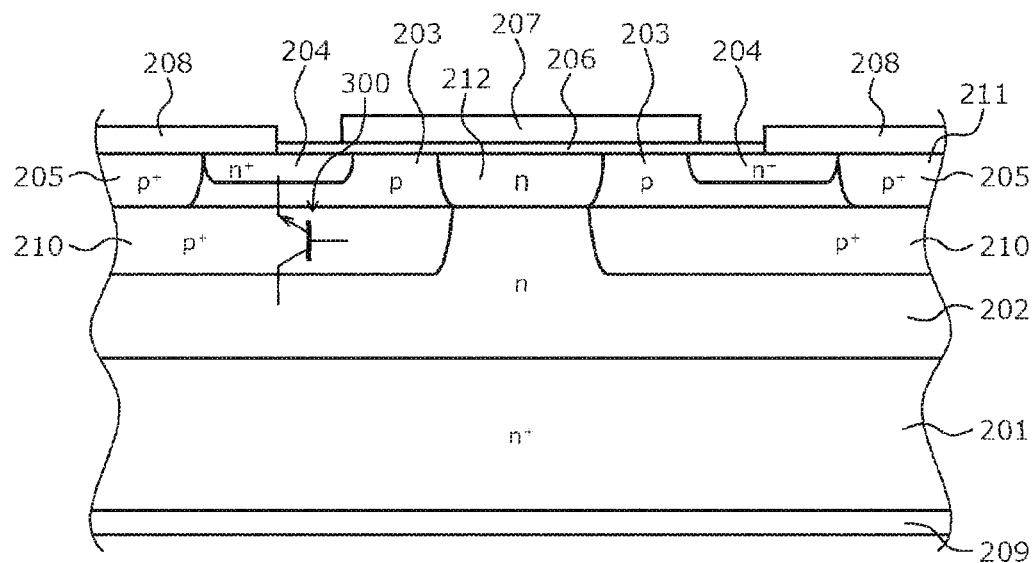
FIG. 8 is a cross-sectional view of a second example of the conventional semiconductor device.

However, with a conventional semiconductor, a parasitic NPN-transistor 300 is incorporated as depicted in FIGS. 7 and 8. When a high voltage is applied to the drain side during switching or the like, voltage is applied to the n$^+$-type silicon carbide type semiconductor substrate 101 and the n-type silicon carbide semiconductor layer 102. The potential of the p-type semiconductor region 103 (the p-type base region) increases due to the voltage increase rate dv/dt of the applied voltage and the p-base resistance immediately beneath the n$^+$-type source region 104, and consequently, the parasitic NPN-transistor 300 operates. A problem therefore arises in that the element is destroyed.

When the conventional semiconductor device is applied to an inverter circuit, large current flows through the semiconductor device because voltage is applied to the gate and the drain. The potential of the p-type semiconductor region 103 (the p-type base region) becomes high due to the large current and the p-base resistance immediately beneath the N$^+$-type source region 104, and the parasitic NPN-transistor 300 operates. A problem therefore arises in that the element is destroyed.

Figure 9:
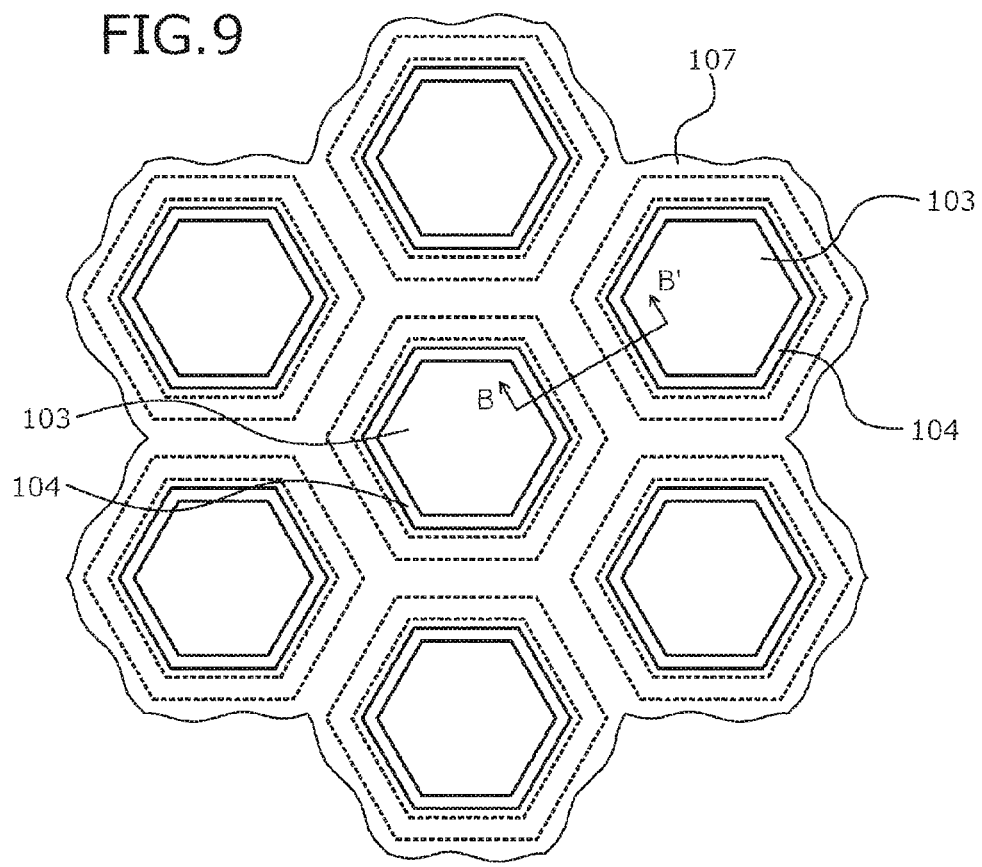
FIG. 9 is a plan diagram of a layout of the conventional semiconductor device.

FIG. 9 depicts only the planar layout of the P-type semiconductor region 103, the n$^+$-type source region 104, and the gate electrode 107. As depicted in FIG. 9, when the p-type semiconductor regions 103 and the n$^+$-type source regions 104 are each disposed to have a polygonal shape, the current concentrates at each of the corners of the polygonal shape and the potential of the p-type semiconductor region 103 is further increased. Another problem therefore arises in that the parasitic NPN-transistor 300 tends to easily operate. In the planar layout diagram depicted in FIG. 9, a cross-sectional view of the structure taken along a cutting line B-B' is depicted in FIGS. 7 and 8.

In the silicon carbide semiconductor device, because an impurity is difficult to be diffused therein, it is difficult to dispose the p-type semiconductor region 103 at a deep position. It is therefore not easy to reduce the p-base resistance. These problems are common to the first and second examples of the conventional semiconductor device.

According to the embodiments, in the surface region of the base region, a region between islands in the source region, or regions on the outer side of both ends of an island of the source region are not a source region but a base region. In the region between islands, or the regions on the outer side of both ends of an island, the thickness of the base region is therefore increased by the thickness of the source region compared to that at a position at which the source region is disposed. The resistance of the base region is therefore reduced compared to that when the source region is continuously disposed without any discontinuity along the gate electrode, whereby increase of the potential of the base region is suppressed. Operation of the parasitic NPN-transistor is therefore suppressed.

In the surface region of the base region, the side where the source region is not disposed acts as the base region. On the side where the source region is not disposed, the thickness of the base region is therefore increased by the thickness of the source region compared to that of the side where the source region is disposed. The resistance of the base region is therefore reduced compared to that when the source region is continuously disposed without any discontinuity along the gate electrode, and increase of the potential of the base region is therefore suppressed. Operation of the parasitic NPN-transistor is suppressed. In the surface region of the base region, a vicinity of the corner portions of the base region does not act as a source region but acts as a p-type base region. In the vicinity of a corner portion of the base region, the thickness of the base region is increased by the thickness of the source region compared to a case where the source region is also disposed in the vicinity of the corner portion at which the current tends to concentrate. The resistance of the base region is therefore reduced compared to that in a case where the source region is also disposed in the vicinity of a corner portion of the base region, and increase of the potential of the base region is therefore suppressed. Operation of the parasitic NPN-transistor is suppressed.

According to the present invention, resistance to breakdown may be improved.

In the description above, the present invention is not limited to the embodiments and may be changed variously. For example, although the first conductivity type is the N type and the second conductivity type is the P type in the embodiments, the present invention also applicable when the first conductivity type is the P type and the second conductivity type is the N type.

As described above, the present invention is useful for a semiconductor device that may be used as, for example, a switching device disposed on a silicon carbide substrate and is especially suitable for a semiconductor device such as a vertical MOSFET that includes silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate of a first conductivity type;
    a semiconductor layer of the first conductivity type, disposed on a first principal surface of the semiconductor substrate, the semiconductor layer having an impurity concentration lower than that of the semiconductor substrate;
    a base region of a second conductivity type, disposed in a surface region of the semiconductor layer;
    a source region of the first conductivity type, disposed in a surface region of the base region;
    a contact region of the second conductivity type, disposed in the surface region of the base region, the contact region having an impurity concentration higher than that of the base region;
    a source electrode in contact with the source region and the contact region;
    a gate insulating film disposed on a portion of the surface region of the base region between the semiconductor layer and the source region;
    a gate electrode disposed on a surface of the gate insulating film; and
    a drain electrode disposed on a second principal surface of the semiconductor substrate, wherein
    the base region includes a plurality of base region portions, each of which, in a top-down view from an angle perpendicular to the first principle surface of the semiconductor substrate, is of a polygonal shape, and
    each adjacent two of the base region portions in the top-down view have two sides, one from each of the two base region portions, that face each other across the gate electrode, the source region being disposed at only one of the two sides.

2. The semiconductor device of claim 1, wherein the semiconductor substrate is formed of silicon carbide.

3. A semiconductor device, comprising:
    a semiconductor substrate of a first conductivity type;
    a semiconductor layer of the first conductivity type, disposed on a first principal surface of the semiconductor substrate, the semiconductor layer having an impurity concentration lower than that of the semiconductor substrate;
    a semiconductor region of a second conductivity type, disposed in a portion of a surface region of the semiconductor layer;
    a base region of the second conductivity type, disposed on a surface of the semiconductor region, the base region having an impurity concentration lower than that of the semiconductor region;
    a well region of the first conductivity type, disposed on a surface of the semiconductor layer and in contact with the base region, the well region having an impurity concentration lower than that of the semiconductor substrate;
    a source region of the first conductivity type, disposed in a surface region of the base region and being away from the well region, the source region having an impurity concentration higher than that of the well region;
    a contact region of the second conductivity type, disposed on the surface of the semiconductor region and in contact with the source region and the base region, the contact region having an impurity concentration higher than that of the base region;
    a source electrode in contact with the source region and the contact region;
    a gate insulating film disposed on a portion of the surface region of the base region between the well region and the source region;
    a gate electrode disposed on a surface of the gate insulating film; and
    a drain electrode disposed on a second principal surface of the semiconductor substrate, wherein
    the base region includes a plurality of base region portions, each of which, in a top-down view from an angle perpendicular to the first principle surface of the semiconductor substrate, is of a polygonal shape, and
    each adjacent two of the base region portions in the top-down view have two sides, one from each of the two base region portions, that face each other across the gate electrode, the source region being disposed at only one of the two sides.

4. The semiconductor device of claim 3, wherein the semiconductor substrate is formed of silicon carbide.

5. The semiconductor device of claim 3, wherein the well region is formed of silicon carbide.

6. A semiconductor device, comprising:
    a semiconductor substrate of a first conductivity type;
    a plurality of base regions of a second conductivity type, formed on a first principal surface of the semiconductor substrate via a semiconductor layer of the first conductivity type, each base region, in a top-down view from an angle perpendicular to the first principle surface, being of a polygonal shape; and
    a plurality of source regions of the first conductivity type formed in the base regions; wherein
    each adjacent two of the base regions in the top-down view have two sides, one from each of the two base regions, that face each other across a portion of the semiconductor layer, the source region being formed at only one of the two sides.

7. The semiconductor device of claim 1, further comprising:
    a plurality of contact regions of the second conductivity type disposed in the base regions;
    a source electrode in contact with the contact regions;
    a gate electrode disposed on the portion of the semiconductor layer and on a portion of the base regions via a gate insulating film; and
    a drain electrode disposed on a second principal surface of the semiconductor substrate.

* * * * *